United States Patent
Xiao et al.

(10) Patent No.: US 9,898,984 B2
(45) Date of Patent: Feb. 20, 2018

(54) GOA CIRCUIT, DISPLAY DEVICE AND DRIVE METHOD OF GOA CIRCUIT

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Ronglei Dai, Guangdong (CN); Yao Yan, Guangdong (CN); Shangcao Cao, Guangdong (CN)

(73) Assignees: Shenzhen China Star Optoelectronics Technology Co., Ltd, Shenzhen, Guangdong (CN); WUHAN CHINA STAR OPTOELECTRONICS TECHNOLOGY CO., LTD, Wuhan, Hubei (CN)

( * ) Notice: Subject to any disclaimer, the term of this patent is extended or adjusted under 35 U.S.C. 154(b) by 179 days.

(21) Appl. No.: 14/888,426

(22) PCT Filed: Sep. 29, 2015

(86) PCT No.: PCT/CN2015/091051
§ 371 (c)(1),
(2) Date: Oct. 31, 2015

(87) PCT Pub. No.: WO2017/049659
PCT Pub. Date: Mar. 30, 2017

(65) Prior Publication Data
US 2017/0162148 A1    Jun. 8, 2017

(51) Int. Cl.
*G09G 3/36* (2006.01)
*G02F 1/1362* (2006.01)

(52) U.S. Cl.
CPC ......... *G09G 3/3674* (2013.01); *G02F 1/1362* (2013.01); *G09G 3/3648* (2013.01); *G09G 2300/0408* (2013.01); *G09G 2300/0434* (2013.01); *G09G 2310/0202* (2013.01); *G09G 2310/0218* (2013.01)

(58) Field of Classification Search
CPC ............... G09G 3/3674; G09G 3/3648; G09G 2300/0408; G09G 2300/0434; G09G 2310/0218; G09G 2310/0202; G02F 1/1362
See application file for complete search history.

(56) References Cited

U.S. PATENT DOCUMENTS

| | | | | |
|---|---|---|---|---|
| 2010/0245298 A1* | 9/2010 | Chen | ...... | G09G 3/3677 345/204 |
| 2011/0187691 A1* | 8/2011 | Chung | ...... | G09G 5/00 345/211 |
| 2015/0106646 A1* | 4/2015 | Lee | ...... | G09G 3/3677 713/400 |

* cited by examiner

*Primary Examiner* — Premal Patel
(74) *Attorney, Agent, or Firm* — Andrew C. Cheng

(57) ABSTRACT

The invention discloses a GOA circuit, a display device and a drive method of a GOA circuit, the GOA circuit is set to be GOA units including a plurality of levels, a N leveled GOA unit is applied to charge a N leveled scanning line of a display region of the display device, the N leveled scanning line is connected to a first gate all on signal and a second gate all on signal, which can guarantee scanning lines corresponding to all the GOA units are being charged under control of the first gate all on signal and the second gate all on signal. The invention can carry out an all gate on function according to the method above.

15 Claims, 4 Drawing Sheets

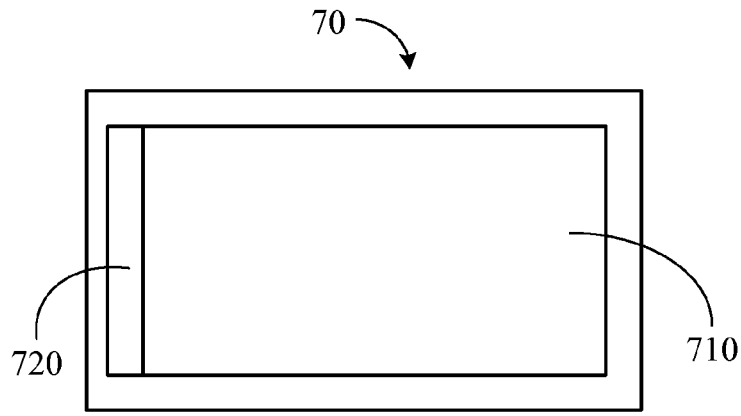

Fig. 6

| Setting a GOA circuit to be GOA units with a plurality of levels, setting a N leveled GOA unit to charge a N leveled horizontal scanning line of a display region of the display device | 801 |

| During an all gate on process, connecting the N leveled horizontal scanning line to a first gate all on signal and a second gate all on signal to guarantee horizontal scanning lines corresponding to all the GOA units being charged under control of the first gate all on signal and the second gate all on signal | 802 |

Fig. 7

GOA CIRCUIT, DISPLAY DEVICE AND DRIVE METHOD OF GOA CIRCUIT

BACKGROUND

1. Technical Field

The invention relates to the field of display technology, and more particularly to a GOA circuit, a display device and a drive method of a GOA circuit.

2. Description of the Related Art

A gate driver on array or gate on array (GOA) circuit mounts a gate scan driver on array signal circuit on an array substrate by a conventional thin film transistor-liquid crystal display (TFT-LCD) array process to realize a drive method of scanning a gate line by line. Compared with a conventional circuit of flexibility (COF) process and a circuit of glass (COG) process, a gate driver on array not only cuts budgets, but also eliminates a process of grid direction bonding, which is a benefit for enhancing the capacity of production and the density of integration of a display device.

In practical applications, a display device utilized with a touch panel is in need, hence a GOA circuit is interrupted to cooperate with the function of a touch panel, like cooperating with scanning of a touch panel. Generally, after interrupting signals of a GOA circuit, a display device will be woke up from black screen, a GOA circuit should set all the gates to be charged or turned on, residual potentials in a pixel capacitance are emptied by applying black voltage on data lines to better a display device, the process is called an all gate on process. But a GOA circuit according to a conventional technique has a risk of decline, which cannot carry out the all gate on function stably.

In summary, a GOA circuit according to a conventional technique fails to meet the requirement of stable work of the all gate on function.

SUMMARY

The invention provides a GOA circuit, a display device and a drive method of a GOA circuit, which can carry out an all gate on function stably.

To solve the previous technical problem, a first proposal according to the invention is providing a GOA circuit, which is applied to drive a display device, the GOA circuit includes a plurality of levels of GOA units, a N level of the GOA units is applied to charge a N leveled scanning line of a display region of the display device, the N leveled scanning line is connected to a first gate all on signal and a second gate all on signal, which is applied to charge scanning lines corresponding to all the GOA units under control of the first gate all on signal and the second gate all on signal, where N is a positive integer that is larger than or equal to 1.

The N leveled GOA unit includes a gate all on control module, the gate all on control module includes a first transistor, a grid of the first transistor receives the first gate all on signal, a source electrode of the first transistor receives the second gate all on signal, a drain electrode of the first transistor and the N leveled scanning line are connected.

The N leveled GOA unit includes a N leveled pull-up control module, a N leveled pull-up module, a N leveled pull-down module and a N leveled pull-down maintenance module; an output terminal of the N leveled pull-up control module is connected to a N leveled grid signal location; an input terminal of the N leveled pull-up module is connected to the N leveled grid signal location, a control terminal of the N leveled pull-up module receives a first clock signal, an output terminal of the N leveled pull-up module is connected to the N leveled scanning line; an input terminal of the N leveled pull-down module and a N leveled pull-down gate all on signal location are connected, a control terminal of the N leveled pull-down module receives a first voltage signal, an output terminal of a N leveled pull-down module is connected to the N leveled grid signal location and the N leveled scanning line respectively; a control terminal of the N leveled pull-down maintenance module receives a second clock signal or a third clock signal, an output terminal of the N leveled pull-down maintenance module is connected to the N leveled pull-down gate all on signal location.

The N leveled pull-up control module outputs a pull-up gate all on signal to the N leveled grid signal location, which makes the pull-up module outputs the first clock signal to the N scanning line responding to the pull-up gate all on signal, after charging the N scanning line responding to the first clock signal, the N leveled pull-down maintenance module outputs the second clock signal or the third clock signal to the N leveled pull-down gate all on signal location, which makes the pull-down module transmits the first voltage signal to the N leveled grid signal location and the N leveled scanning line respectively, which can turn off the N leveled scanning line, and the N leveled pull-down maintenance module continues to respond to the second clock signal or the third clock signal and maintain the N leveled scanning line turned off.

The N leveled pull-up control module includes a second transistor, a third transistor and a fourth transistor; a grid of the second transistor receives a positive scanning signal, a source electrode of the second transistor is connected to a scanning line of a former leveled GOA unit, a drain electrode of the second transistor is connected to a source electrode of the fourth transistor; a grid of the third transistor receives a negative scanning signal, a source electrode of the third transistor is connected to scanning lines of the later leveled GOA unit, a drain electrode of the third transistor is connected to a source electrode of the fourth transistor; a grid of the fourth transistor receives a fourth clock signal, a drain electrode of the fourth transistor is connected to the N leveled grid signal location.

The N leveled pull-up module includes a fifth transistor and a first capacitor; a grid of the fifth transistor is connected to the N leveled grid signal location, a source electrode of the fifth transistor receives the first clock signal, a drain electrode of the fifth transistor is connected to the N leveled scanning line; one end of the first capacitor is connected to a grid of the fifth transistor, the other end of the capacitor is connected to the N leveled scanning line.

The N leveled pull-down module includes a sixth transistor and a seventh transistor; a grid of the sixth transistor is connected to the N leveled pull-down gate all on signal location, a source electrode of the sixth transistor receives the first voltage signal, a drain electrode of the sixth transistor is connected to the N leveled grid signal location; a grid of the seventh transistor is connected to the N leveled pull-down gate all on signal location, a source electrode of the seventh transistor receives the first voltage signal, a drain electrode of the seventh transistor is connected to the N leveled scanning line; the N leveled pull-down maintenance module includes an eighth transistor, a ninth transistor and a tenth transistor; a grid of the eighth transistor receives a positive scanning signal, a source electrode of the eighth transistor receives the second clock signal, a drain of the eighth transistor is connected to a grid of the tenth transistor; a grid of the ninth transistor receives a negative scanning signal, a source electrode of the ninth transistor receives the third clock signal, a drain electrode of the ninth transistor is connected to a grid of the tenth transistor; a source electrode of the tenth transistor receives a second voltage signal, a drain electrode of the tenth transistor is connected to the N leveled pull-down gate all on signal location.

The N leveled GOA unit also includes a pull-down maintenance module, the pull-down maintenance module includes an eleventh transistor, a grid of the eleventh transistor receives the second gate all on signal, a source electrode of the eleventh transistor receives the first voltage signal, a drain electrode of the eleventh transistor is connected to the N leveled pull-down gate all on signal location.

To solve the previous technical problem, a second proposal according to the invention is providing a display device, the display device includes a GOA circuit, the GOA circuit includes a plurality of levels of GOA units, a N leveled GOA unit is applied to charge a N leveled scanning line of a display region of the display device, the N leveled scanning line is connected to a first gate all on signal and a second gate all on signal, which is applied to charge scanning lines corresponding to all the GOA units under control of the first gate all on signal and the second gate all on signal, where N is a positive integer that is larger than or equal to 1.

The N leveled GOA unit includes a gate all on control module, the gate all on control module includes a first transistor, a grid of the first transistor receives the first gate all on signal, a source electrode of the first transistor receives the second gate all on signal, a drain electrode of the first transistor and the N leveled scanning line are connected.

The N leveled GOA unit includes a N leveled pull-up control module, a N leveled pull-up module, a N leveled pull-down module and a N leveled pull-down maintenance module; an output terminal of the N leveled pull-up control module is connected to a N leveled grid signal location; an input terminal of the N leveled pull-up module is connected to the N leveled grid signal location, a control terminal of the N leveled pull-up module receives a first clock signal, an output terminal of the N leveled pull-up module is connected to the N leveled scanning line; an input terminal of the N leveled pull-down module and a N leveled pull-down gate all on signal location are connected, a control terminal of the N leveled pull-down module receives a first voltage signal, an output terminal of a N leveled pull-down module is connected to the N leveled grid signal location and the N leveled scanning line respectively; a control terminal of the N leveled pull-down maintenance module receives a second clock signal or a third clock signal, an output terminal of the N leveled pull-down maintenance module is connected to the N leveled pull-down gate all on signal location.

The N leveled pull-up control module outputs a pull-up gate all on signal to the N leveled grid signal location, which leads to the pull-up module outputs the first clock signal to the N leveled scanning line responding to the pull-up gate all on signal, after charging the N leveled scanning line responding to the first clock signal, the N leveled pull-down maintenance module outputs the second clock signal or the third clock signal to the N leveled pull-down gate all on signal location, hence the pull-down module transmits the first voltage signal to the N leveled grid signal location and the N leveled scanning line respectively, which can turn off the N leveled scanning line, and the N leveled pull-down maintenance module continues to respond to the second clock signal or the third clock signal and maintain the N leveled scanning line turned off.

The N leveled pull-up control module includes a second transistor, a third transistor and a fourth transistor; a grid of the second transistor receives a positive scanning signal, a source electrode of the second transistor is connected to a scanning line of a former leveled GOA unit, a drain electrode of the second transistor is connected to a source electrode of the fourth transistor; a grid of the third transistor receives a negative scanning signal, a source electrode of the third transistor is connected to scanning lines of the later leveled GOA unit, a drain electrode of the third transistor is connected to a source electrode of the fourth transistor; a grid of the fourth transistor receives a fourth clock signal, a drain electrode of the fourth transistor is connected to the N leveled grid signal location.

The N leveled pull-up module includes a fifth transistor and a first capacitor; a grid of the fifth transistor is connected to the N leveled grid signal location, a source electrode of the fifth transistor receives the first clock signal, a drain electrode of the fifth transistor is connected to the N leveled scanning line; one end of the first capacitor is connected to a grid of the fifth transistor, the other end of the capacitor is connected to the N leveled scanning line.

The N leveled pull-down module includes a sixth transistor and a seventh transistor; a grid of the sixth transistor is connected to the N leveled pull-down gate all on signal location, a source electrode of the sixth transistor receives the first voltage signal, a drain electrode of the sixth transistor is connected to the N leveled grid signal location; a grid of the seventh transistor is connected to the N leveled pull-down gate all on signal location, a source electrode of the seventh transistor receives the first voltage signal, a drain electrode of the seventh transistor is connected to the N leveled scanning line; the N leveled pull-down maintenance module includes an eighth transistor, a ninth transistor and a tenth transistor; a grid of the eighth transistor receives a positive scanning signal, a source electrode of the eighth transistor receives the second clock signal, a drain of the eighth transistor is connected to a grid of the tenth transistor; a grid of the ninth transistor receives a negative scanning signal, a source electrode of the ninth transistor receives the third clock signal, a drain electrode of the ninth transistor is connected to a grid of the tenth transistor; a source electrode of the tenth transistor receives a second voltage signal, a drain electrode of the tenth transistor is connected to the N leveled pull-down gate all on signal location.

The N leveled GOA unit also includes a pull-down maintenance module, the pull-down maintenance module includes an eleventh transistor, a grid of the eleventh transistor receives the second gate all on signal, a source electrode of the eleventh transistor receives the first voltage signal, a drain electrode of the eleventh transistor is connected to the N leveled pull-down gate all on signal location.

To solve the technical problem above, a third proposal according to the invention is providing a drive method of a GOA circuit, the drive method includes the following steps: setting a GOA circuit to be a plurality of GOA units, and setting a N level of the GOA units to charge a N leveled scanning line of a display region of the display device; during an all gate on process, connecting the N leveled scanning line to a first gate all on signal and a second gate all on signal in order to charge scanning lines corresponding to all the GOA units under control of the first gate all on signal and the second gate all on signal; where N is a positive integer that is larger than or equal to 1.

Benefits of the invention: a GOA circuit, a display device and a drive method of a GOA circuit according to the invention are setting a GOA circuit to be a plurality of GOA units, a N level of the GOA units charges a N leveled scanning line of a display region of the display device, the N leveled scanning line is connected to a first gate all on signal and a second gate all on sign also as to charge scanning lines corresponding to all the GOA units under control of the first gate all on signal and the second gate all on signal. Compared with conventional technique, each level of the scanning lines connected to the first gate all on signal and the second gate all on signal according to the invention is charged or turned on when the first gate all on signal and the second gate all on signal are active, which can carry out the all gate on function stably.

BRIEF DESCRIPTION OF THE DRAWINGS

For further description of exemplary embodiments of the invention, figures of exemplary embodiments are referred to illustrate, obviously, the following figures are merely detailed description of the preferred embodiments, for those skilled persons in the art, various modifications and variations can be made according to the figures of the invention without creation.

FIG. 6 is a schematic structural view of a display device according to an exemplary embodiment of the invention.

FIG. 7 is a flow chart of a drive method of a GOA circuit according to an exemplary embodiment of the invention.

DETAILED DESCRIPTION

In the following detailed description of the preferred embodiments, reference is made to the accompanying drawings which form a part hereof, and in which is shown by way of illustration specific embodiments in which the invention may be practiced.

Figure 1:
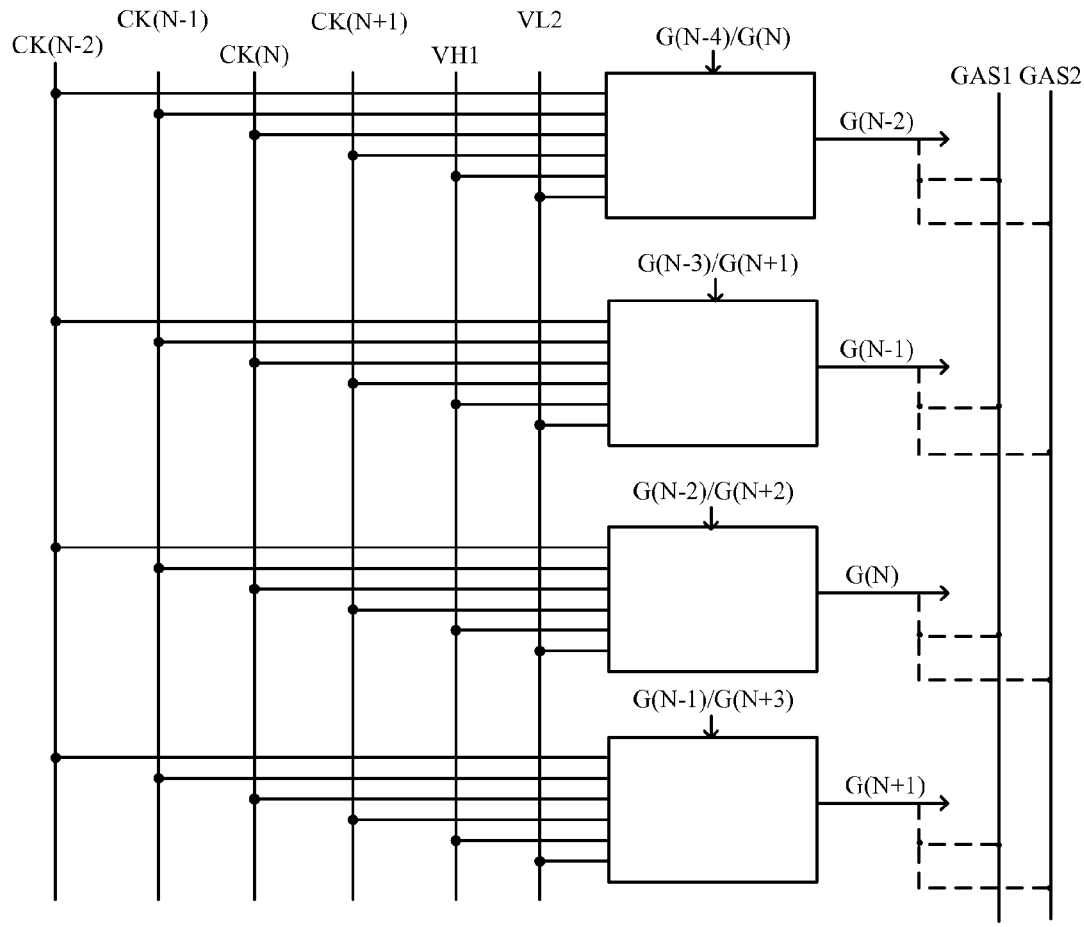
FIG. 1 is a schematic structural view of each GOA unit connected with each other in a GOA circuit according to an exemplary embodiment of the invention.

Referring to FIG. 1, FIG. 1 is a schematic structural view of each GOA unit connected to each other in a GOA circuit according to an exemplary embodiment of the invention. As shown in FIG. 1, the GOA circuit includes a plurality of levels of GOA units, a N level of the GOA units is applied to charge a N leveled scanning line (G(N)) of a display region of the display device, the N leveled scanning line (G(N)) is connected to a first gate all on signal (GAS1) and a second gate all on signal (GAS2), which is applied to charge scanning lines corresponding to all the GOA units under control of the first gate all on signal (GAS1) and the second gate all on signal (GAS2), where N is a positive integer that is larger than or equal to 1.

The exemplary embodiment in FIG. 1 includes four GOA units, which are a N−2 leveled, a N−1 leveled, a N leveled, a N+1 leveled GOA units, being connected to four pulse signals CK(N−2), CK(N−1), CK(N) and CK(N+1) as well as a first voltage signal VH1 and a second voltage signal VL2 respectively, and the four GOA units is driven by scanning every other line, moreover, the invention also provides a positive scanning drive and a negative scanning drive, when it is a positive scanning drive, trigger signals (or named grid signals) input from terminals of the N−2 leveled, the N−1 leveled, the N leveled and the N+1 leveled GOA units are signals on scanning lines (G(N−4)), (G(N−3)), (G(N−2)) and (G(N−1)) of a N−4 leveled, a N−3 leveled, the N−2 leveled and the N−1 leveled GOA units respectively; when it is a negative scanning drive, trigger signals input from the N−2 leveled, the N−1 leveled, the N leveled, the N+1 leveled GOA units are signals on scanning lines (G(N)), (G(N+1)), (G(N+2)) and (G(N+3)) of the N leveled, the N+1 leveled, a N+2 leveled and a N+3 leveled GOA units respectively.

Figure 2:
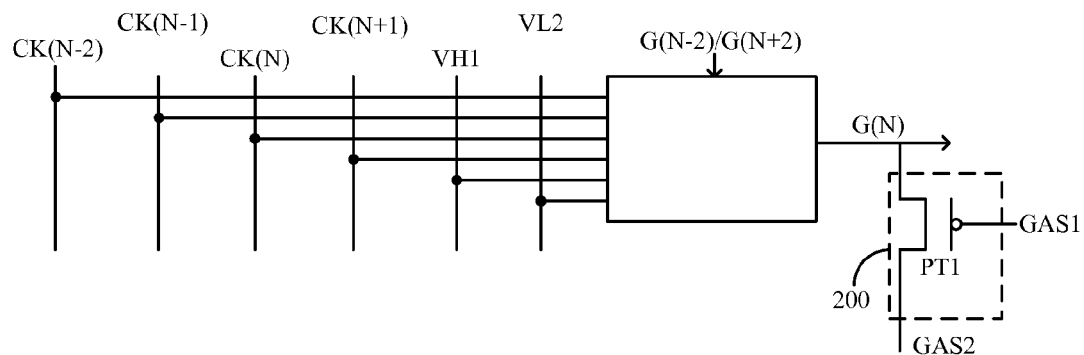
FIG. 2 is a schematic structural view of a circuit of a connection of a gate all on signal (GAS) and a N leveled GOA unit in FIG. 1.

Referring to FIG. 2, FIG. 2 is a schematic structural view of a circuit of a connection of a gate all on signal (GAS) and a N leveled GOA unit in FIG. 1. As shown in FIG. 2, The N leveled GOA unit includes a gate all on control module 200, the gate all on control module 200 includes a first transistor PT1, the transistor in all the exemplary embodiments and figures is a P-type field effect transistor, a grid of the first transistor PT1 receives the first gate all on signal (GAS1), a source electrode of the first transistor PT1 receives the second gate all on signal (GAS2), a drain electrode of the first transistor PT1 and the N leveled scanning line (G(N)) are connected.

Accordingly, when the first gate all on signal (GAS1) and the second gate all on signal (GAS2) are both low potentials, the first transistor PT1 is on, the second gate all on signal (GAS2) of the source electrode is transmitted to the drain electrode, the N leveled scanning line (G(N)) is also a low potential to turn on or charge the scanning line of the level. For the same reason, all the scanning lines corresponding to the GOA units are charged or turned on by controlling the first gate all on signal (GAS1) and the second gate all on signal (GAS2) during the all gate on process, residual potentials in a pixel capacitance are emptied by applying black voltage on data lines to carry out the all gate on function.

Figure 3:
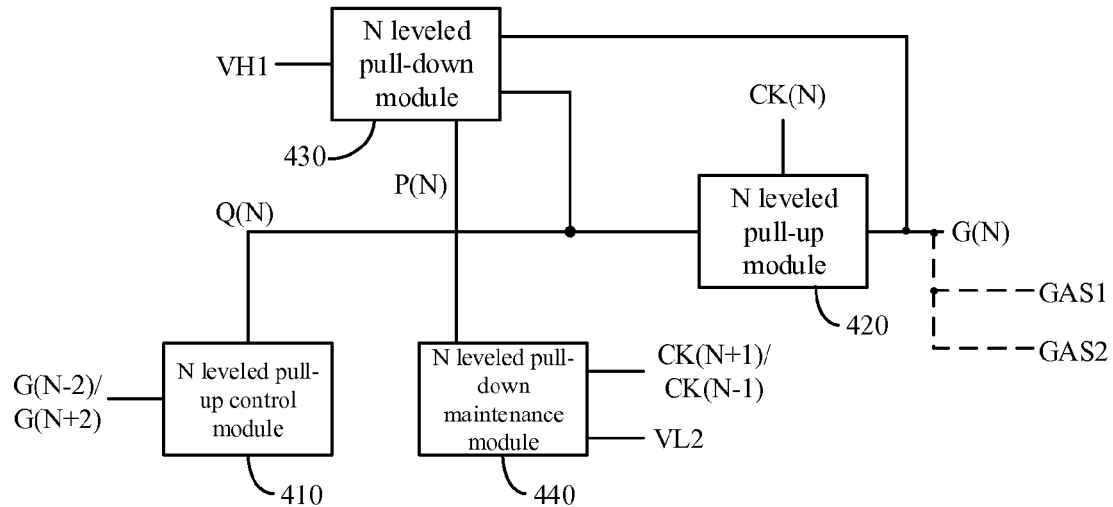
FIG. 3 is a schematic structural view of a circuit connection of the N leveled GOA unit in FIG. 1.
Figure 4:
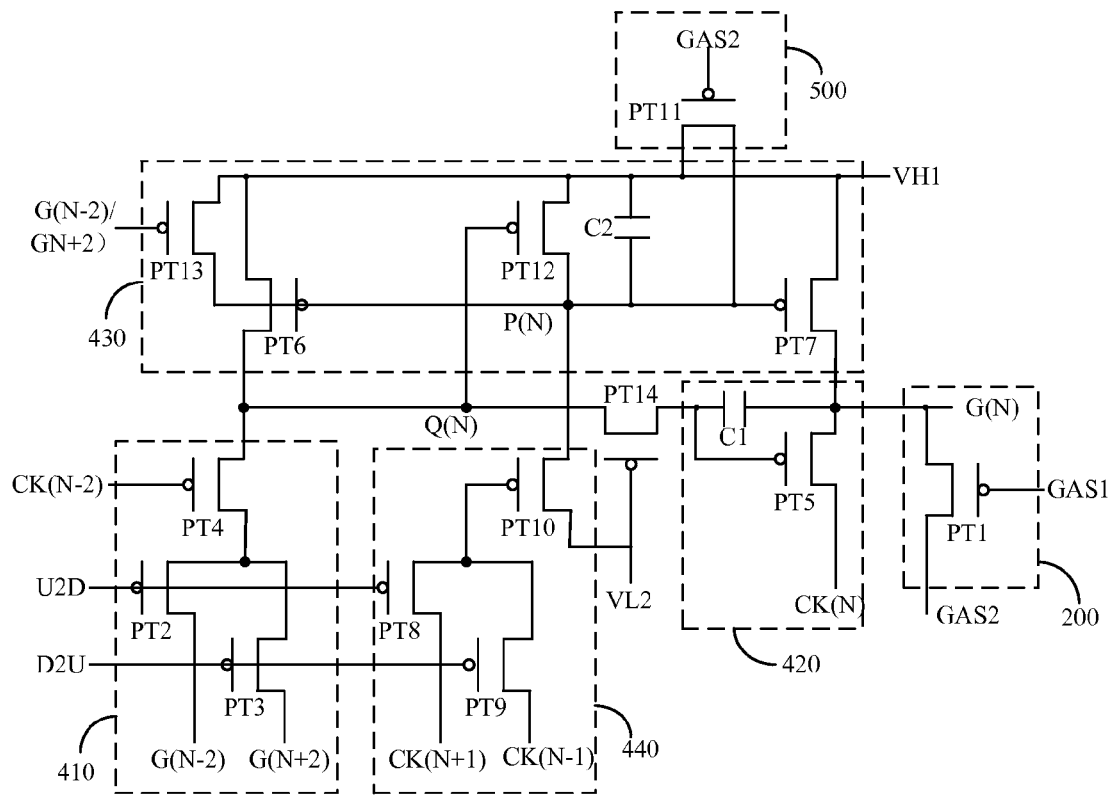
FIG. 4 is a schematic structural view of a circuit connection of a N leveled GOA unit in FIG. 3.

Referring to FIG. 3, FIG. 3 is a schematic structural view of a circuit connection of the N leveled GOA unit in FIG. 1. As shown in FIG. 4, the N leveled GOA unit includes a N leveled pull-up control module 410, a N leveled pull-up module 420, a N leveled pull-down module 430 and a N leveled pull-down maintenance module 440; an output terminal of the N leveled pull-up control module 410 is connected to a N leveled grid signal location (Q(N)); an input terminal of the N leveled pull-up module 420 is connected to the N leveled grid signal location (Q(N)), a control terminal of the N leveled pull-up module 420 receives a first clock signal (CK(N)), an output terminal of the N leveled pull-up module 420 is connected to the N leveled scanning line (G(N)); an input terminal of the N leveled pull-down module 430 and a N leveled pull-down gate all on signal location (P(N)) are connected, a control terminal of the N leveled pull-down module 430 receives a first voltage signal VH1, an output terminal of a N leveled pull-down module 430 is connected to the N leveled grid signal location (Q(N)) and the N leveled scanning line (G(N)) respectively; a control terminal of the N leveled pull-down maintenance module 440 receives a second clock signal (CK(N+1) or a third clock signal CK(N−1)), an output terminal of the N leveled pull-down maintenance module 440 is connected to the N leveled pull-down gate all on signal location (P(N)); during a process of displaying properly, the N leveled pull-up control module 410 outputs a pull-up gate all on signal to the N leveled grid signal location (Q(N)), which makes the pull-up module 420 outputs the first clock signal (CK(N)) to the N scanning line (G(N)) responding to the pull-up gate all on signal, after charging the N leveled scanning line (G(N)) responding to the first clock signal (CK(N)), the N leveled pull-down maintenance module 440 outputs the second clock signal (CK(N+1) or the third clock signal (CK(N−1)) to the N leveled pull-down gate all on signal location (P(N)), which makes the pull-down module 430 transmits the first voltage signal VH1 to the N leveled grid signal location (Q(N)) and the N leveled scanning line (G(N)) respectively, which can turn off the N leveled scanning line (G(N)), and the N leveled pull-down maintenance module 440 continues to respond to the second clock signal (CK(N+1) or the third clock signal CK(N−1)) and maintain the N leveled scanning line (G(N)) turned off.

During a process of displaying properly, an input terminal of the pull-up control module 410 of the N leveled GOA unit can be connected to a transmission level signal or a grid signal from the former leveled GOA unit such as the N+2 leveled or the N−2 leveled GOA unit, which are also signals on the N+2 leveled or the N−2 leveled scanning line (G(N+2)) or (G(N−2)), applied to control turn on time of the pull-up module 420, which is also the output pull-up gate all on signal, the pull-up module 420 is applied to output the first clock signal (CK(N)) to the N leveled scanning line (G(N)) responding to the pull-up gate all on signal to turn on the scanning line of the level, which is used to load a grayscale voltage for proper display of current images on the corresponding data lines, after the line of subpixels receive the grayscale voltage that can display properly, the N leveled pull-down maintenance module 440 outputs the second clock signal (CK(N+1)) or the third clock signal (CK(N−1)) to the N leveled pull-down gate all on signal location (P(N)), and turns off the N leveled scanning line (G(N)) by the N leveled pull-down module 430 until the next image is displayed, the scanning line of the level is reopened.

The GOA circuit in the exemplary embodiments takes an example of a P-type field effect transistor, the first voltage signal VH1 is set to be a high level, the second voltage signal VH2 is a low level.

Referring to FIG. 4, FIG. 4 is a schematic structural view of a circuit connection of a N leveled GOA unit in FIG. 3. As shown in FIG. 4, the N leveled pull-up control module 410 includes a second transistor PT2, a third transistor PT3 and a fourth transistor PT4.

A grid of the second transistor PT2 receives a positive scanning signal (U2D), a source electrode of the second transistor PT2 is connected to a scanning line of a former leveled GOA unit, which is a scanning line (G(N−2)) of the N−2 leveled GOA unit, a drain electrode of the second transistor PT2 is connected to a source electrode of the fourth transistor PT4.

A grid of the third transistor PT3 receives a negative scanning signal (D2U), a source electrode of the third transistor PT3 is connected to scanning lines (G(N+2)) of the later leveled GOA unit that is also the N+2 leveled GOA unit, a drain electrode of the third transistor PT3 is connected to a source electrode of the fourth transistor PT4.

A grid of the fourth transistor PT4 receives a fourth clock signal (CK(N−2)), a drain electrode of the fourth transistor PT4 is connected to the N leveled grid signal location (Q(N)).

The N leveled pull-up module 420 includes a fifth transistor PT5 and a first capacitor C1; a grid of the fifth transistor PT5 is connected to the N leveled grid signal location (Q(N)), a source electrode of the fifth transistor PT5 receives the first clock signal (CK(N)), a drain electrode of the fifth transistor PT5 is connected to the N leveled scanning line (G(N)); one end of the first capacitor C1 is connected to a grid of the fifth transistor PT5, the other end of the capacitor C1 is connected to the N leveled scanning line (G(N)).

The N leveled pull-down module 430 includes a sixth transistor PT6 and a seventh transistor PT7.

A grid of the sixth transistor PT6 is connected to the N leveled pull-down gate all on signal location (P(N)), a source electrode of the sixth transistor PT6 receives the first voltage signal VH1, a drain electrode of the sixth transistor PT6 is connected to the N leveled grid signal location (Q(N)).

A grid of the seventh transistor PT7 is connected to the N leveled pull-down gate all on signal location (P(N)), a source electrode of the seventh transistor PT7 receives the first voltage signal VH1, a drain electrode of the seventh transistor PT7 is connected to the N leveled scanning line (G(N)).

A second capacitor C2 can be disposed between the first voltage signal VH1 and the N leveled pull-down gate on all signal location (P(N)) to maintain and store potentials of the N leveled pull-down gate on all signal location (P(N)), which can make it more stable.

The N leveled pull-down maintenance module 440 includes an eighth transistor PT8, a ninth transistor PT9 and a tenth transistor PT10;

a grid of the eighth transistor PT8 receives a positive scanning signal (U2D), a source electrode of the eighth transistor PT8 receives the second clock signal (CK(N+1)), a drain of the eighth transistor PT8 is connected to a grid of the tenth transistor PT10; a grid of the ninth transistor PT9 receives a negative scanning signal (D2U), a source electrode of the ninth transistor PT9 receives the third clock signal (CK(N−1)), a drain electrode of the ninth transistor PT9 is connected to a grid of the tenth transistor PT10; a source electrode of the tenth transistor PT10 receives a second voltage signal VL2, a drain electrode of the tenth transistor PT10 is connected to the N leveled pull-down gate all on signal location (P(N)).

FIG. 4 also shows a gate all on module 200 included in the N leveled GOA unit.

The N leveled GOA unit also includes a pull-down maintenance module 500, the pull-down maintenance module 500 includes an eleventh transistor PT11, a grid of the eleventh transistor PT11 receives the second gate all on signal (GAS2), a source electrode of the eleventh transistor PT11 receives the first voltage signal VH1, a drain electrode of the eleventh transistor PT11 is connected to the N leveled pull-down gate all on signal location (P(N)). When the pull-down maintenance module 500 is applied in the all gate on process, the N leveled pull-down gate all on signal location (P(N)) in the pull-down module 430 locates at a high potential of the first voltage signal VH1 under control of the second gate all on signal (GAS2), which makes the seventh transistor PT7 and the sixth transistor PT6 are cut off or turned off, resulting in the N leveled scanning line (G(N)) is only influenced by the gate all on module 200 in the GOA unit.

During the proper process that after the all gate on process, a twelfth transistor PT12 and a thirteenth transistor PT13 are disposed on each level of the pull-down modules to make potential of each node in each level of GOA units more stable. Specifically, in the N leveled GOA unit shown in FIG. 4, a grid of the twelfth transistor PT12 is connected to the N leveled grid signal location (Q(N)), a drain electrode of the twelfth transistor PT12 receives the first voltage signal VH1, a source electrode of the twelfth transistor PT12 is connected to the N leveled pull-down gate all on signal location (P(N)). A grid of the thirteenth transistor PT13 is connected to the former leveled GOA scanning line, if it is a positive drive, the scanning line (G(N−2)) of the N−2 leveled GOA unit is connected, if it is a negative drive, the scanning line (G(N+2)) of the N+2 leveled GOA unit is connected; a drain electrode of the thirteenth transistor PT13 receives the first voltage signal VH1, a source electrode of the thirteenth transistor PT13 is connected to the N leveled pull-down gate all on signal location (P(N)).

Furthermore, in order to reduce leakage currents between the N leveled grid signal location (Q(N)) and the first capacitor C1, a fourteenth transistor PT14 is disposed, a grid of the fourteenth transistor PT14 is connected to the second voltage signal VL2, which turns on the fourteenth transistor, the drain electrode and the source electrode are connected to the N leveled grid signal location (Q(N)) and the first capacitor C1 respectively.

Figure 5:
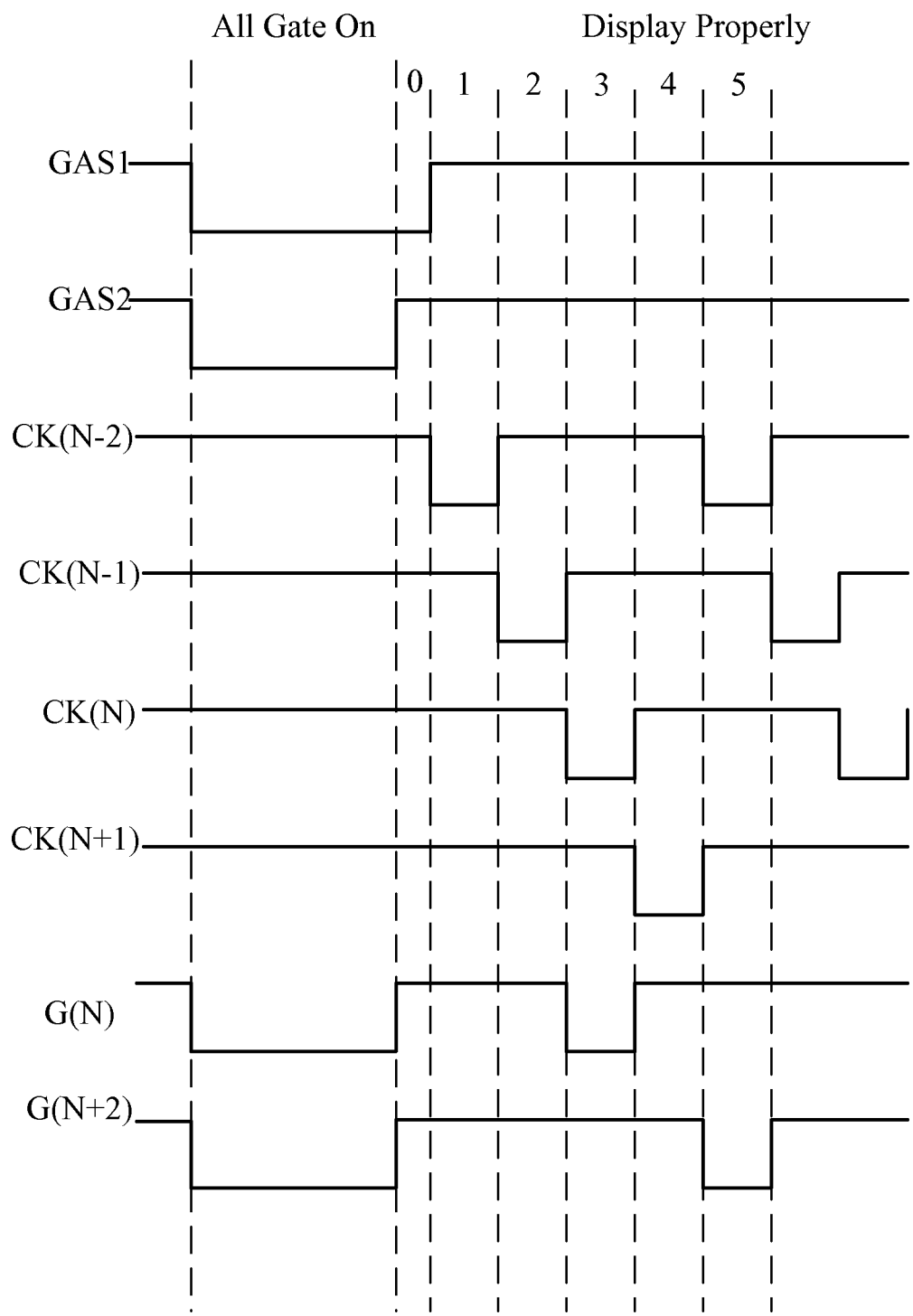
FIG. 5 is a schematic of a waveform of the N leveled GOA unit in an all gate on process and a proper display process in FIG. 4.

Referring to FIG. 5, FIG. 5 is a schematic of a waveform of a N leveled GOA unit in the all gate on process and displaying properly in FIG. 4.

As shown in FIG. 5, during the all gate on process, four pulse signals CK(N−2), CK(N−1), CK(N) and CK(N+1) are all high level potentials, as the first gate all on signal (GAS1) and the second gate all on signal (GAS2) are both low level potentials, the first transistor PT1 and the eleventh transistor PT11 turn on, the N leveled pull-down gate all on signal location (P(N)) is the first voltage signal VH1, which is a high potential and cuts off the sixth transistor PT6 and seventh transistor PT7, the N leveled scanning line (G(N)) is the second gate all on signal (GAS2), which is being charged and able to turn on the scanning line.

Based on the same reason, during the all gate on process, as each leveled GOA unit in the GOA circuit according to the invention has similar circuit structure, connections of four pulse signals can be various, the four pulse signals are pulse cycles that duty is ¼ respectively, and adjacent pulse signals are disposed with an interval, which is CK(N) and CK(N+4i) are the same pulse signals, i is an integer. Like CK(N−2), CK(N−1), CK(N) and CK(N+1) are the same pulse signals compared with CK(N+2), CK(N+3), CK(N+4) and CK(N+5) respectively. Hence each level of GOA units can charge or turn on corresponding scanning lines under control of the first gate all on signal (GAS1) and the second gate all on signal (GAS2), which can carry out the all gate on function.

After the all gate on process, shown as a 0 section, the first gate all on signal (GAS1) is a low level, the second gate all on signal (GAS2) is a high level, the N leveled scanning line (G(N)) is a high level, the scanning line of the level is cut off. Each level GOA unit can cut off the corresponding scanning line under control of the first gate all on signal (GAS1) and the second gate all on signal (GAS2) in order to cut off all the scanning lines after the all gate on process.

Referring to FIG. 4, after displaying properly (shown in FIG. 5 as Display Properly), the first gate all on signal (GAS1) and the second gate all on signal (GAS2) are high levels during the process, which can be divided up into five sections 1-5 in FIG. 5 to pull-up control, pull-up maintain, pull up, pull down and pull-down maintain the N leveled GOA unit.

Taking the positive scanning drive as an example to illustrate combining with FIG. 4, that is U2D is a low potential, D2U is a high potential. The first section is a pull-up control section, a pull-up control module 510 receives signals of the scanning line (G(N−2)) of the former level of GOA unit or the N−2 leveled GOA unit, which is a low potential, as it is a positive scanning drive, the second transistor PT2 is on, and the drain electrode is a low potential, CK(N−2) is a low potential as well, which turns on the fourth transistor PT4, and the N leveled grid signal location (Q(N)) is a low potential. Since the first clock signal CK(N) is a high level, though a pull-up module 520 transmits the first clock signal CK(N) to the N leveled scanning line, the N leveled scanning line cannot be charged.

In addition, the twelfth transistor PT12 and the thirteenth transistor PT13 are on, resulting in the N leveled pull-down gate all on signal location (P(N)) is the first voltage signal VH1, which is a high potential, the sixth transistor PT6 and the seventh transistor PT7 are cut off to make potential of each node in the N leveled GOA unit stable.

The second section is a pull-up maintenance section, the fourth pulse signal CK(N−2) is a high level, the fourth transistor PT4 and the thirteenth transistor PT13 are cut off, potential of each node in the GOA unit is constant.

The third section is a pull-up section, the first clock signal CK(N) is a low level, since the fourteenth transistor PT14 is mostly on, which makes the fifth transistor PT5 transmit the first clock signal CK(N) to the N leveled scanning line (G(N)) so as to turn on the scanning line of the level.

The fourth section is a pull-down section, the eighth transistor PT8 transmits a low potential signal of the second clock signal CK(N+1) to a grid of the tenth transistor PT10, the tenth transistor PT10 is on and transmits a low potential of the second voltage signal VL2 to the N leveled pull-down gate all on signal location (P(N)), which turns on the sixth transistor PT6 and the seventh transistor PT7, and the N leveled grid signal location (Q(N)) and the N leveled scanning line (G(N)) are both high potentials of the first voltage signal VH1 and cut off the N leveled scanning line (G(N)).

The fifth section is a pull-down maintenance section, the second clock signal CK(N+1) is a high level, and the tenth transistor PT10 is cut off, potential of each node in the GOA unit is constant until the scanning line of the level re-enters the proper display sections 1-5 when the next image is driven.

Accordingly, during the proper display process that follows the all gate on process, scanning lines of each of the levels need to be reset, which means being cut off or turned off, 0 section in FIG. 6 is a reset section, the N leveled pull-down gate all on signal location (P(N)) is controlled to be a low potential to turn on the sixth transistor PT6 and the seventh transistor PT7, and high potentials of the first voltage signal VH1 are transmitted to the N leveled grid signal location (Q(N)) and the N leveled scanning line (G(N)).

Potential variations of the N+2 leveled scanning line (G(N+2)) in the N+2 leveled GOA unit in a process of all gate on and display properly are also shown in FIG. 6. Specifically, the N+2 leveled scanning line (G(N+2)) is a low potential influenced by the first gate all on signal (GAS1) and the second gate all on signal (GAS2) during the all gate on process for sake of turning on the scanning line to empty residual potentials; during the proper display process, after the former GOA unit that is the N leveled GOA unit can display properly, when the fourth clock signal CK(N−2) (same with CK(N+2)) is a low level, the scanning line is turned on to display grayscale of pixels connected by the scanning line.

If the N leveled GOA unit works with a negative scanning driven, the positive scanning signal (U2D) is a high potential, the negative scanning signal (D2U) is a low potential; variation of each node in circuits of each level of the GOA units is similar with the previous positive scanning drive process that can be referred.

In other exemplary embodiments, each transistor in the previous GOA circuits can be a N-type field effect tube, a P-type triode, a N-type triode. When the transistor is P-typed, potential variation of each of the nodes is same as that of the positive scanning drive process above; when the transistor is N-typed, potential variation of each of the nodes is opposite to that of the positive scanning drive process above, and the first voltage signal VH1 and the second voltage signal VL2 are opposite to the potential when it is a positive scanning drive, in other words, when the transistor is N-typed, the first voltage signal VH1 is a low level, the second voltage signal VL2 is a high level, the same details will be omitted.

Referring to FIG. 6, FIG. 6 is a schematic structural view of a display device according to an exemplary embodiment of the invention. A display device 70 includes one GOA circuit according to the invention above.

Specifically, the display device 70 is a liquid crystal display or a light emitting diode (LED), including a display panel 710 and one GOA circuit 720 according to the invention above.

Referring to FIG. 7, FIG. 7 is a flow chart of a drive method of a GOA circuit according to an exemplary embodiment of the invention. The GOA circuit in FIG. 7 and the GOA circuit 720 included in the display device above share the same structure and function, same with one GOA circuit according to the invention above, the drive method includes the following steps.

Step 801: setting a GOA circuit to be a plurality of levels of GOA units, and setting a N level of the GOA units to charge a N leveled scanning line (G(N)) of a display region of the display device;

Step 802: during the all gate on process, connecting the N leveled scanning line (G(N)) to a first gate all on signal (GAS1) and a second gate all on signal (GAS2) in order to charge scanning lines corresponding to all the GOA units under control of the first gate all on signal (GAS1) and the second gate all on signal (GAS2).

Where N is a positive integer that is larger than or equal to 1.

Connecting the N leveled scanning line (G(N)) to a first gate all on signal (GAS1) and a second gate all on signal (GAS2) in step 802 also includes: a grid of the first transistor receiving the first gate all on signal (GAS1), a source of the first transistor receiving second gate all on signal (GAS2), connecting a drain electrode of the first electrode and the N leveled scanning line (G(N)).

Acceptably, if the first transistor is a P-type transistor, and the first gate all on signal (GAS1) and the second gate all on signal (GAS2) are low levels, then the first transistor is on, and potentials of the drain electrode and the source electrode are the same with the low level of the second gate all on signal (GAS2), the N leveled scanning line (G(N)) is a low level, as well as being charged or turned on.

After step 802, the drive method also includes the following steps.

During the proper display process, the N leveled pull-up control module outputs a pull-up control signal to the N leveled grid signal location (Q(N)).

The pull-up module outputs the first clock signal (CK(N)) to the N scanning line (G(N)) responding to the pull-up gate all on signal.

After charging the N scanning line (G(N)) responding to the first clock signal (CK(N)), the N leveled pull-down maintenance module outputs the second clock signal (CK(N+1) or the third clock signal (CK(N−1)) to the N leveled pull-down gate all on signal location (P(N));

The pull-down module transmits the first voltage signal to the N leveled grid signal location (Q(N)) and the N leveled scanning line (G(N)) respectively according to the potential of the N leveled pull-down gate all on signal location (P(N)).

The N leveled pull-down maintenance module continues to respond to the second clock signal (CK(N+1) or the third clock signal CK(N−1)) and maintains the N leveled scanning line (G(N)) turned off.

The N leveled pull-up control module, the N leveled pull-up module, the N leveled pull-down module and the N leveled pull-down maintenance module are same with the N leveled pull-up control module 410, the N leveled pull-up module 420, the N leveled pull-down module 430 and the N leveled pull-down maintenance module 440 in the previous GOA circuit, which can execute functions of the corresponding modules during the proper display process and details are skipped.

During the proper display process, before the step that the N leveled pull-up control module outputs a pull-up control signal to the N leveled grid signal location (Q(N)), the drive method also includes: resetting the N leveled scanning line to be cut off or turned off.

Furthermore, in the step 802, the drive method also includes: during the all gate on process, turning on a grid of the eleventh transistor by the second gate all on signal (GAS2), transmitting the first voltage signal from the source electrode of the eleventh transistor to the N leveled pull-down gate all on signal location (P(N)), which makes the pull-down module, the N leveled grid signal location (Q(N)) and the N leveled scanning line (G(N)) cut off. Referring to the description above, cutting off the pull-down module, the N leveled grid signal location (Q(N)) and the N leveled scanning line (G(N)) is cutting off the sixth transistor and the seventh transistor connected by the pull-down module and the N leveled pull-down gate all on signal location (P(N)). Cutting off the sixth transistor and the seventh transistor can guarantee potentials of each node of the entire GOA circuit are more stable during the all gate on process.

Distinguishing from conventional technique, the GOA circuit, the display device and the drive method of a GOA circuit according to the invention, set the GOA circuit to be a plurality of levels of GOA units, the N level of the GOA units is applied to charge the N leveled scanning line (G(N)) of a display region of the display device, during the all gate on process, connect the N leveled scanning line (G(N)) to the first gate all on signal (GAS1) and the second gate all on signal (GAS2) in order to charge scanning lines (G(N)) corresponding to all the GOA units under control of the first gate all on signal (GAS1) and the second gate all on signal (GAS2), the grid of the eleventh transistor is connected to the second gate all on signal (GAS2) to control the potential of the N leveled pull-down gate all on signal location (P(N)) stably. During the proper display process, the N leveled scanning line (G(N)) is charged and turned off after being charged by the N leveled pull-up control module, the N leveled pull-up module, the N leveled pull-down module and the N leveled pull-down maintenance module.

The embodiments are preferred chosen and described in order to best explain the present invention. It is not intended to be exhaustive or to limit the invention to the precise form or to exemplary embodiments disclosed. The scope of the invention is defined by the claims appended hereto and their equivalents in which all terms are meant in their broadest reasonable sense.

What is claimed is:

1. A GOA circuit, applied to drive a display device, wherein the GOA circuit comprises a plurality of levels of GOA units, a N level of the GOA units is applied to charge a N leveled scanning line of a display region of the display device, the N leveled scanning line is connected to a first gate all on signal and a second gate all on signal, which is applied to guarantee scanning lines corresponding to all the GOA units are being charged under control of the first gate all on signal and the second gate all on signal, where N is a positive integer that is larger than or equal to 1;

wherein the N leveled GOA unit comprises a N leveled pull-up control module, a N leveled pull-up module, a N leveled pull-down module and a N leveled pull-down maintenance module;

an output terminal of the N leveled pull-up control module is connected to a N leveled grid signal location;

an input terminal of the N leveled pull-up module is connected to the N leveled grid signal location, a control terminal of the N leveled pull-up module receives a first clock signal, an output terminal of the N leveled pull-up module is connected to the N leveled scanning line;

an input terminal of the N leveled pull-down module and a N leveled pull-down gate all on signal location are connected, a control terminal of the N leveled pull-down module receives a first voltage signal, an output terminal of a N leveled pull-down module is connected to the N leveled grid signal location and the N leveled scanning line respectively;

a control terminal of the N leveled pull-down maintenance module receives a second clock signal or a third clock signal, an output terminal of the N leveled pull-down maintenance module is connected to the N leveled pull-down gate all on signal location;

wherein the N leveled pull-up control module outputs a pull-up gate all on signal to the N leveled grid signal location, which leads to the pull-up module outputs the first clock signal to the N leveled scanning line responding to the pull-up gate all on signal, after charging the N leveled scanning line responding to the first clock signal, the N leveled pull-down maintenance module outputs the second clock signal or the third clock signal to the N leveled pull-down gate all on signal location, hence the pull-down module transmits the first voltage signal to the N leveled grid signal location and the N leveled scanning line respectively, which can turn off the N leveled scanning line, and the N leveled pull-down maintenance module continues to respond to the second clock signal or the third clock signal and maintain the N leveled scanning line turned off.

2. The GOA circuit according to claim 1, wherein the N leveled GOA unit comprises a gate all on control module, the gate all on control module comprises a first transistor, a grid of the first transistor receives the first gate all on signal, a source electrode of the first transistor receives the second gate all on signal, a drain electrode of the first transistor and the N leveled scanning line are connected.

3. The GOA circuit according to claim 1, wherein the N leveled pull-up control module comprises a second transistor, a third transistor and a fourth transistor;

a grid of the second transistor receives a positive scanning signal, a source electrode of the second transistor is connected to a scanning line of a former leveled GOA unit, a drain electrode of the second transistor is connected to a source electrode of the fourth transistor;

a grid of the third transistor receives a negative scanning signal, a source electrode of the third transistor is connected to scanning lines of the later leveled GOA unit, a drain electrode of the third transistor is connected to a source electrode of the fourth transistor;

a grid of the fourth transistor receives a fourth clock signal, a drain electrode of the fourth transistor is connected to the N leveled grid signal location.

4. The GOA circuit according to claim 1, wherein the N leveled pull-up module comprises a fifth transistor and a first capacitor;

a grid of the fifth transistor is connected to the N leveled grid signal location, a source electrode of the fifth transistor receives the first clock signal, a drain electrode of the fifth transistor is connected to the N leveled scanning line;

one end of the first capacitor is connected to a grid of the fifth transistor, the other end of the capacitor is connected to the N leveled scanning line.

5. The GOA circuit according to claim 1, wherein the N leveled pull-down module comprises a sixth transistor and a seventh transistor;

a grid of the sixth transistor is connected to the N leveled pull-down gate all on signal location, a source electrode of the sixth transistor receives the first voltage signal, a drain electrode of the sixth transistor is connected to the N leveled grid signal location;

a grid of the seventh transistor is connected to the N leveled pull-down gate all on signal location, a source electrode of the seventh transistor receives the first voltage signal, a drain electrode of the seventh transistor is connected to the N leveled scanning line;

the N leveled pull-down maintenance module comprises an eighth transistor, a ninth transistor and a tenth transistor;

a grid of the eighth transistor receives a positive scanning signal, a source electrode of the eighth transistor receives the second clock signal, a drain of the eighth transistor is connected to a grid of the tenth transistor;

a grid of the ninth transistor receives a negative scanning signal, a source electrode of the ninth transistor receives the third clock signal, a drain electrode of the ninth transistor is connected to a grid of the tenth transistor;

a source electrode of the tenth transistor receives a second voltage signal, a drain electrode of the tenth transistor is connected to the N leveled pull-down gate all on signal location.

6. The GOA circuit according to claim 5, wherein the N leveled GOA unit also comprises a pull-down maintenance module, the pull-down maintenance module comprises an eleventh transistor, a grid of the eleventh transistor receives the second gate all on signal, a source electrode of the eleventh transistor receives the first voltage signal, a drain electrode of the eleventh transistor is connected to the N leveled pull-down gate all on signal location.

7. A display device, wherein the display device comprises a GOA circuit, the GOA circuit comprises a plurality of levels of GOA units, a N leveled GOA unit is applied to charge a N leveled scanning line of a display region of the display device, the N leveled scanning line is connected to a first gate all on signal and a second gate all on signal, which is applied to charge scanning lines corresponding to all the GOA units under control of the first gate all on signal and the second gate all on signal, where N is a positive integer that is larger than or equal to 1;

wherein the N leveled GOA unit comprises a N leveled pull-up control module, a N leveled pull-up module, a N leveled pull-down module and a N leveled pull-down maintenance module;

an output terminal of the N leveled pull-up control module is connected to a N leveled grid signal location;

an input terminal of the N leveled pull-up module is connected to the N leveled grid signal location, a control terminal of the N leveled pull-up module receives a first clock signal, an output terminal of the N leveled pull-up module is connected to the N leveled scanning line;

an input terminal of the N leveled pull-down module and a N leveled pull-down gate all on signal location are connected, a control terminal of the N leveled pull-down module receives a first voltage signal, an output terminal of a N leveled pull-down module is connected to the N leveled grid signal location and the N leveled scanning line respectively;

a control terminal of the N leveled pull-down maintenance module receives a second clock signal or a third clock signal, an output terminal of the N leveled pull-down maintenance module is connected to the N leveled pull-down gate all on signal location;

wherein the N leveled pull-up control module outputs a pull-up gate all on signal to the N leveled grid signal location, which leads to the pull-up module outputs the first clock signal to the N leveled scanning line responding to the pull-up gate all on signal, after charging the N leveled scanning line responding to the first clock signal, the N leveled pull-down maintenance module outputs the second clock signal or the third clock signal to the N leveled pull-down gate all on signal location, hence the pull-down module transmits the first voltage signal to the N leveled grid signal location and the N leveled scanning line respectively, which can turn off the N leveled scanning line, and the N leveled pull-down maintenance module continues to respond to the second clock signal or the third clock signal and maintain the N leveled scanning line turned off.

8. The display device according to claim 7, wherein the N leveled GOA unit comprises a gate all on control module, the gate all on control module comprises a first transistor, a grid of the first transistor receives the first gate all on signal, a source electrode of the first transistor receives the second gate all on signal, a drain electrode of the first transistor and the N leveled scanning line are connected.

9. The display device according to claim 7, wherein the N leveled pull-up control module comprises a second transistor, a third transistor and a fourth transistor;

a grid of the second transistor receives a positive scanning signal, a source electrode of the second transistor is connected to a scanning line of a former leveled GOA unit, a drain electrode of the second transistor is connected to a source electrode of the fourth transistor;

a grid of the third transistor receives a negative scanning signal, a source electrode of the third transistor is connected to scanning lines of the later leveled GOA unit, a drain electrode of the third transistor is connected to a source electrode of the fourth transistor;

a grid of the fourth transistor receives a fourth clock signal, a drain electrode of the fourth transistor is connected to the N leveled grid signal location.

10. The display device according to claim 7, wherein the N leveled pull-up module comprises a fifth transistor and a first capacitor;

a grid of the fifth transistor is connected to the N leveled grid signal location, a source electrode of the fifth transistor receives the first clock signal, a drain electrode of the fifth transistor is connected to the N leveled scanning line;

one end of the first capacitor is connected to a grid of the fifth transistor, the other end of the capacitor is connected to the N leveled scanning line.

11. The display device according to claim 7, wherein the N leveled pull-down module comprises a sixth transistor and a seventh transistor;

a grid of the sixth transistor is connected to the N leveled pull-down gate all on signal location, a source electrode of the sixth transistor receives the first voltage signal, a drain electrode of the sixth transistor is connected to the N leveled grid signal location;

a grid of the seventh transistor is connected to the N leveled pull-down gate all on signal location, a source electrode of the seventh transistor receives the first voltage signal, a drain electrode of the seventh transistor is connected to the N leveled scanning line;

the N leveled pull-down maintenance module comprises an eighth transistor, a ninth transistor and a tenth transistor;

a grid of the eighth transistor receives a positive scanning signal, a source electrode of the eighth transistor receives the second clock signal, a drain of the eighth transistor is connected to a grid of the tenth transistor;

a grid of the ninth transistor receives a negative scanning signal, a source electrode of the ninth transistor receives the third clock signal, a drain electrode of the ninth transistor is connected to a grid of the tenth transistor;

a source electrode of the tenth transistor receives a second voltage signal, a drain electrode of the tenth transistor is connected to the N leveled pull-down gate all on signal location.

12. The display device according to claim 11, wherein the N leveled GOA unit also comprises a pull-down maintenance module, the pull-down maintenance module comprises an eleventh transistor, a grid of the eleventh transistor receives the second gate all on signal, a source electrode of the eleventh transistor receives the first voltage signal, a drain electrode of the eleventh transistor is connected to the N leveled pull-down gate all on signal location.

13. A drive method of a GOA circuit, applied to drive a display device, wherein the drive method comprises the following steps:

setting a GOA circuit to be a plurality of GOA units, and setting a N level of the GOA units to charge a N leveled scanning line of a display region of the display device;

during an all gate on process, connecting the N leveled scanning line to a first gate all on signal and a second gate all on signal in order to charge scanning lines corresponding to all the GOA units under control of the first gate all on signal and the second gate all on signal;

where N is a positive integer that is larger than or equal to wherein the step of connecting the N leveled scanning line to a first gate all on signal and a second gate all on signal further comprises: a grid of a first transistor receiving the first gate all on signal, a source of the first transistor receiving the second gate all on signal, connecting a drain electrode of a first electrode and the N leveled scanning line;

wherein the drive method further comprises:

a N leveled pull-up control module outputting a pull-up control signal to a N leveled grid signal location during a proper display process;

a pull-up module outputting a first clock signal to a N scanning line responding to a pull-up gate all on signal;

after charging the N scanning line responding to the first clock signal, a N leveled pull-down maintenance module outputting a second clock signal or a third clock signal to a N leveled pull-down gate all on signal location;

a pull-down module transmitting a first voltage signal to the N leveled grid signal location and the N leveled scanning line respectively according to the potential of the N leveled pull-down gate all on signal location; and the N leveled pull-down maintenance module continuing to respond to the second clock signal or the third clock signal and maintaining the N leveled scanning line turned off.

14. The drive method of a GOA circuit according to claim 13, wherein before the step of the N leveled pull-up control module outputting the pull-up control signal to the N leveled grid signal location during the proper display process, the drive method further comprises: resetting the N leveled scanning line to be cut off or turned off.

15. The drive method of a GOA circuit according to claim 13, wherein the drive method further comprises: during the all gate on process, turning on a grid of an eleventh transistor by the second gate all on signal, transmitting the first voltage signal from a source electrode of the eleventh transistor to the N leveled pull-down gate all on signal location, which makes the pull-down module, the N leveled grid signal location and the N leveled scanning line cut off.

* * * * *